United States Patent [19]

Nakamura et al.

[11] Patent Number: 4,468,584

[45] Date of Patent: Aug. 28, 1984

[54] UNIDIRECTIONAL FLEXURE TYPE TUNING FORK CRYSTAL VIBRATOR

[75] Inventors: Tutomu Nakamura, Akashi; Tamotsu Koyama, Kashihara, both of Japan

[73] Assignee: Sharp Kabushiki Kaisha, Osaka, Japan

[21] Appl. No.: 347,098

[22] Filed: Feb. 9, 1982

Related U.S. Application Data

[63] Continuation of Ser. No. 57,988, Jul. 16, 1979, abandoned, which is a continuation of Ser. No. 838,053, Sep. 30, 1977, abandoned.

[30] Foreign Application Priority Data

Oct. 1, 1976 [JP] Japan ................................ 51-118735

[51] Int. Cl.³ ............................................ H01L 41/08
[52] U.S. Cl. .................................... 310/370; 310/366
[58] Field of Search ............................... 310/366–368, 310/370

[56] References Cited

U.S. PATENT DOCUMENTS

| | | | |
|---|---|---|---|
| 1,899,503 | 2/1933 | Hansell | 310/366 |
| 3,488,530 | 1/1970 | Staudte | 310/370 |
| 3,944,862 | 3/1976 | Shimoi et al. | 310/370 X |
| 3,969,641 | 7/1976 | Oguchi et al. | 310/370 X |
| 4,126,802 | 11/1978 | Hermann | 310/370 X |

FOREIGN PATENT DOCUMENTS

| | | | |
|---|---|---|---|
| 4415032 | 1/1966 | Japan | 310/370 |
| 1425435 | 2/1976 | United Kingdom | 310/370 |

*Primary Examiner*—Mark O. Budd
*Attorney, Agent, or Firm*—Birch, Stewart, Kolasch & Birch

[57] ABSTRACT

In a flexure crystal, flexural vibration will occur when a unidirectional electric field is applied thereto in a manner that strength of the electric field varies from point to point. For the fork type of crystal vibrator, each of branches is provided with electrodes at the top wall, the bottom wall and the outer side wall for application of the strength-variable unidirectional electric field.

7 Claims, 10 Drawing Figures

UNIDIRECTIONAL FLEXURE TYPE TUNING FORK CRYSTAL VIBRATOR

This application is a continuation of copending application Ser. No. 057,988, filed on July 16, 1979, which is a continuation of application Ser. No. 838,053 filed Sept. 30, 1977, both now abandoned.

BACKGROUND OF THE INVENTION

The present invention relates to a crystal vibrator of the type where flexural vibration is created by utilizing variations in distributed electric field strength.

DESCRIPTION OF THE PRIOR ART

A typical prior art fork type crystal vibrator is illustrated in a cross sectional view of FIG. 1, which comprises two branches 1,2 each having a top electrode 3, 4, a bottom electrode 5, 6, an outer side electrode 7, 8 and an inner side electrode 9, 10. Assume now that a voltage is applied across terminals 10, 11, 12 as shown in the drawing. An electric field is developed as shown by the arrow such that the electric field within one branch is opposite to that within the other branch with respect to the X axis. Consequently, one half of the respective branches 1, 2 is inclined to expand itself while the second half of the respective branches is inclined to contract, thereby causing flexure. When an alternating voltage is applied across the terminals 11, 12, the respective branches 1, 2, manifest flexural vibration along the X and Y axes.

The above described vibrator is named "XY flexural type" or "X'Y flexural type". Meanwhile, another type of crystal vibrator has been proposed, which could be implemented with conventional semiconductor manufacture techniques. For example, as shown in FIG. 2, a fork type crystal vibrator of a remarkably thin profile is well known using an NT cut crystal plate. In FIG. 2, the portion of the structure pointed out by element numbers 13, and 14 represent outer top electrodes, elements 15, 6 represent inner top electrodes and elements 17, 18 represent bottom electrodes. Although arrangement of the respective electrodes is different from the example of FIG. 1, an electric field is developed as shown by the arrow upon application of a voltage across the terminals 19, 20 and, when an alternating voltage is applied thereto, flexural vibration is caused by the X axis component thereof in the manner similar to FIG. 1. It is noted that an electric axis is denoted as "X axis", a mechanical axis is denoted as "Y axis" and an optical axis is denoted as "Z axis".

However, in the prior art vibrator of FIG. 1, the respective inner side electrodes 9, 10 should be slantwise deposited through a slit of a mask screen. This provided a barrier to a small-sized crystal vibrator. Although the latest crystal vibrator of FIG. 2 could overcome such a barrier and assure a higher accuracy of frequency with a laser frequency trimming technique, the X axis component of the electric field is comparatively small so that crystal impedance is high. Difficulties have been encountered in exciting such a high impedance crystal vibrator by a conventional CMOS-IC driver.

SUMMARY OF THE INVENTION

Accordingly, it is an object of the present invention to provide a new and useful crystal vibrator and a method for driving the crystal vibrator which can eliminate the disadvantages discussed with respect to both the prior art crystal vibrators.

In accordance with the present invention, there is provided a flexural type crystal vibrator which comprises an electrode arrangement adapted to develop an effective electric field onto the crystal vibrator only in one direction when an appropriate voltage is applied. With such an arrangement, strength of the electric field is varied from point to point to stimulate flexural vibration. It is noted that a component of the electric field only in the one direction is effective to excite flexural vibration pursuant to the concept of the present invention. In other words, a strength-varied unidirectional electric field is applied to the crystal vibrator to effect flexural vibration. If the strength of the electric field is varied from point to point, then degree of expansion will be correspondingly varied.

In contrast, with the prior art crystal vibrators, as stated above, the electric field was applied such that the one half inclined to expand while the second half inclined to contract. In other words, the prior art vibrators could be named "bidirectional flexural type". The results of the inventor's experiments have revealed that only differences in degree of expansion or contraction attributable to differences in electric field distribution are sufficient to stimulate flexural vibration.

Additionally, in one preferred form, the fork type crystal vibrator of the present invention comprises two branches each having electrodes at the top wall, the bottom wall and outer side wall. Therefore, because of the inner side wall electrode omitted from the crystal vibrator, this enables a small-sized crystal vibrator and facilitates deposition of electrodes.

BRIEF DESCRIPTION OF THE DRAWINGS

Other objects and novel features of the present invention are set forth in the appended claims and the present invention as to its organization and its mode of operation will best be understood from a consideration of the following detailed description of the preferred embodiments taken in connection with accompanying drawings, wherein:

DETAILED DESCRIPTION OF THE INVENTION

Figure 3:
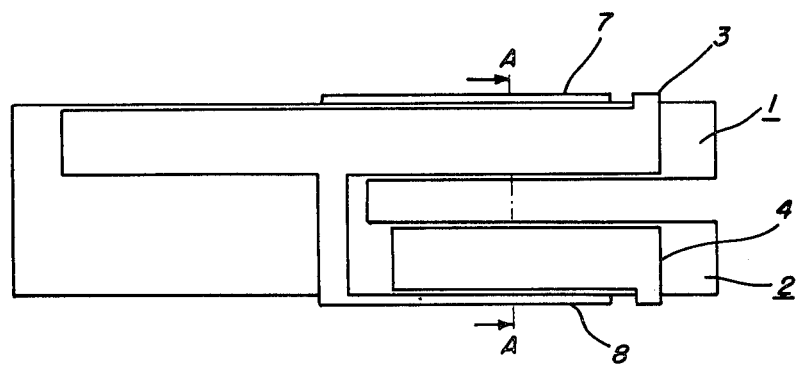
FIG. 3 is a plan view of one preferred form of the present invention.
Figure 4:
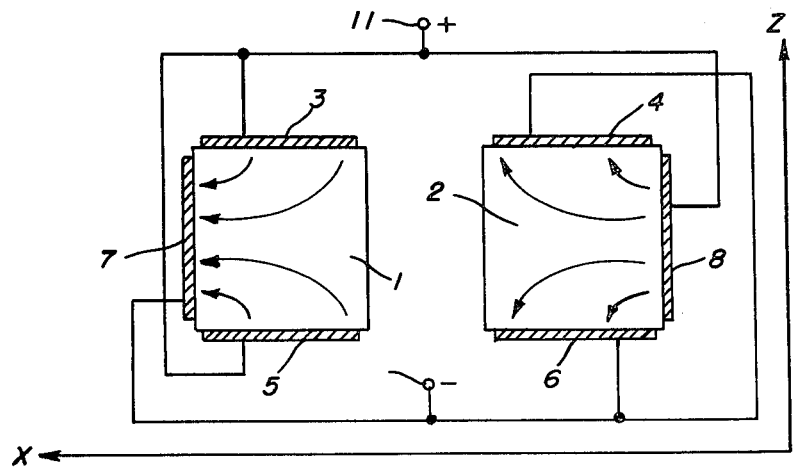
FIG. 4 is a cross-sectional view of the preferred form taken along the line A—A of FIG. 3.

Referring first to FIGS. 3 and 4, one preferred form of the present invention will be described in detail. As clear from FIGS. 3 and 4, an electrode construction for a fork type crystal vibrator is such that the inner side wall electrodes 9, 10 in the prior art are removed from the crystal vibrator. This structural difference in the electrode arrangement is a drastic innovation with respect to the operational principle of the flexure type crystal vibrator.

Assume now that a voltage having a polarity which is shown in FIG. 4 is applied across the terminals 11, 12. An electric field is developed as depicted by the arrow 5 so that unidirectional electric fields are respectively formed within the two branches 1, 2. As a result, lines of electric force are well focused adjacent the outer side electrodes 7, 8 to make the electric field in the X axis stronger, while there is little electric field intensity at the X axis of the inner side wall because of the absence of the inner side electrodes 9, 10. Since the branches 1, 2 of the crystal vibrator extend substantially along the Y axis, flexure will occur in the Y axis direction corresponding to the strength of the X axis direction electric field. It is noted that only the X axis direction electric field can be called an "effective electric field".

Figure 1:
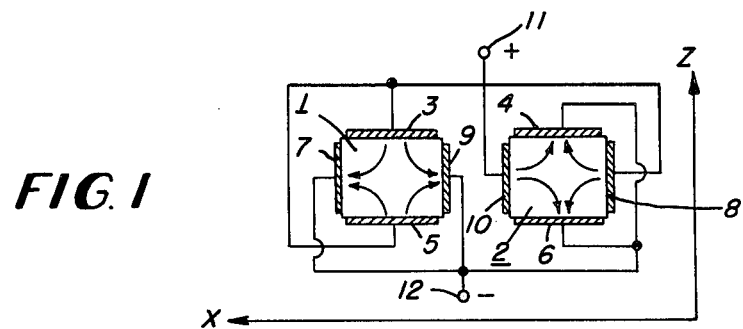
FIG. 1 is a cross-sectional view of a prior art crystal vibrator.

In this instance though since the electric field stands only in the X axis direction of the respective branches 1, 2, the electric field is stronger at the outer side and weaker at the inner side. It follows that degree of expansion or contraction is higher at the outer side and correspondingly lower at the inner side. Therefore, flexure will occur in the X and Y plane. When an alternating voltage is applied across the terminals 11, 12, flexural vibration can be seen at the X-Y plane in the manner similar to FIG. 1.

Such alternating voltage driver implemented with a CMOS integrated circuit is well known. See, for example, U.S. Pat. No. 3,672,155 SOLID STATE WATCH assigned to Hamilton Watch Co., FIG. 8, U.S. Pat. No. 3,676,801 STABILIZED COMPLEMENTARY MICRO-POWER SQUARE WAVE OSCILLATOR assigned to Motorola Inc., FIGS. 3, 4, 6, 9, and U.S. Pat. No. 3,956,880 SOLID STATE WRISTWATCH WITH CHARGE COUPLED DRIVER assigned to Time Computer Inc., FIG. 6, etc.

Fabrication of such crystal vibrator will be carried out in the following manner. A wafer is obtainable from artificial crystal and a crystal blank or a half-furnished crystal product is prepared after polishing, grooving and cutting. Wire saw or band saw are conventionally used for grooving and cutting. Chemical etching techniques such as photoetching can be alternatively employed to make the crystal blank. Deposition of the respective electrodes is accomplished by vapor depositing Cr and Au via an appropriate mask.

Figure 5:
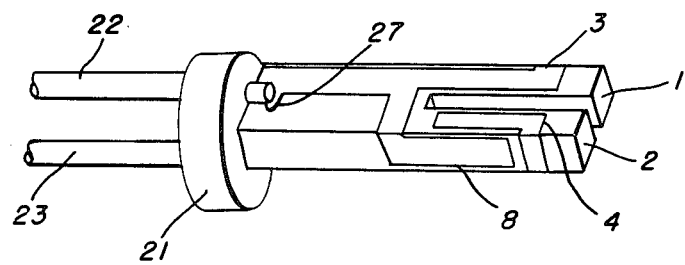
FIG. 5 is a perspective view of the preferred form of FIG. 3 which is mounted on a stem.

Since in the given example the electrodes are omitted from the inner side walls, deposition of the remaining electrodes is facilitated thereby assuring a good yield of crystal vibrators. The thus electrode-deposited crystal vibrator is mounted on a stem 21 as viewed from FIG. 5. To secure the crystal on the stem 21, adhesive or low melting point glass is used and then subject to thermal processing. Electrically conductive paste or solder provides electrical connections between the respective electrodes on the crystal and leading legs 22, 23. Under these circumstances the resonant frequency is trimmed and then the crystal is thermally processed. The crystal vibrator is completed after capping and hermetically sealing.

Figure 2:
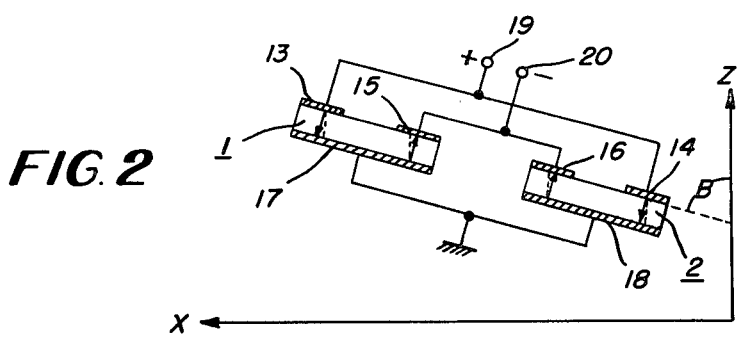
FIG. 2 is a cross-sectional view of another prior art crystal vibrator.
Figures 6A, 6B:
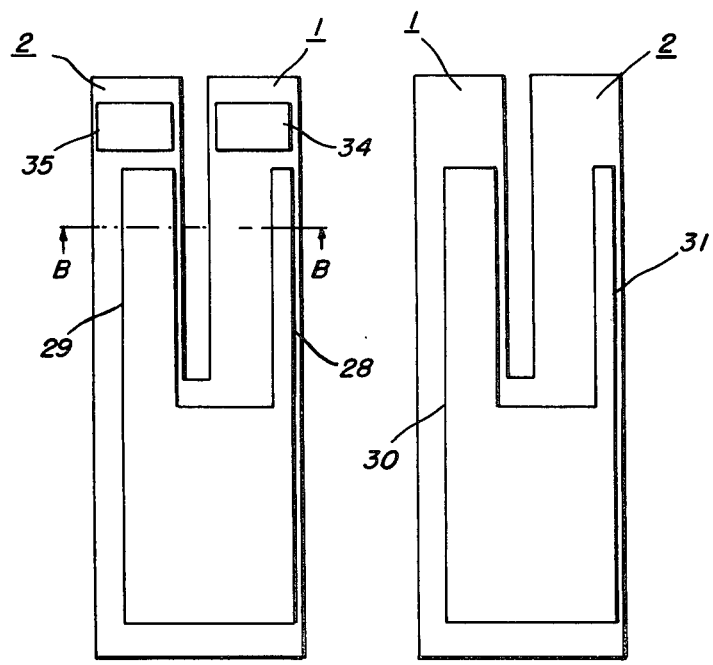
FIGS. 6(a) and 6(b) are a front view and a rear view of another preferred form of the present invention.
Figure 7:
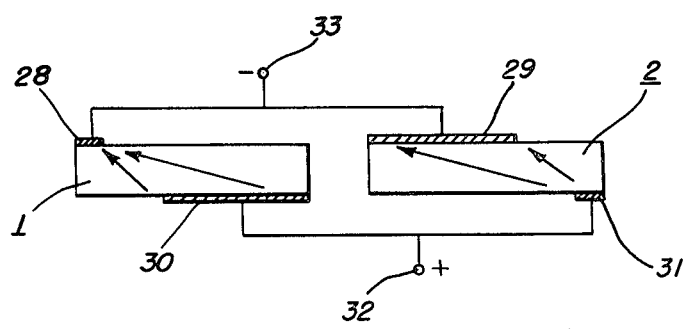
FIG. 7 is a cross-sectional view taken along the line B—B of FIG. 6.

FIGS. 6(a), 6(b) and 7 depict an example of application of the present invention to the thin type like the prior art of FIG. 2. The one branch 1 has a top electrode 28 and a bottom electrode 30 and similarly the other branch 2 has a top electrode 29 and a bottom electrode 31. The respective electrodes on the respective branches 1, 2 are obliquely positioned with differences in shape or dimension.

When the voltage illustrated therein is applied across the terminals 32, 33, an electric field is developed as shown by the arrow. Although the electric field is developed only in one direction in the respective branches, the electric field is stronger at the outside because of the closely adjacent counter electrodes 28, 31, whereas the electric field is weaker at the inside because of a long distance between the electrodes. In conclusion, flexural vibration will occur upon application of an alternating voltage across the terminals 32, 33 in the same manner as the above described embodiment.

As well, crystal impedance of the above crystal vibrator is considerably reduced because the slanting electrodes are positioned at the respective branches 1, 2 and therefore the X axis component not shown of the electric field is increased. The resonant frequency can be easily adjusted provided that trimming electrodes 34, 35 are deposited at the tips of the respective branches 1, 2 and portions of the trimming electrodes are properly removed by exposure to laser beams. Therefore, highly accurate crystal vibrators adapted for mass production can be obtained with for example photoetching.

Figure 8:
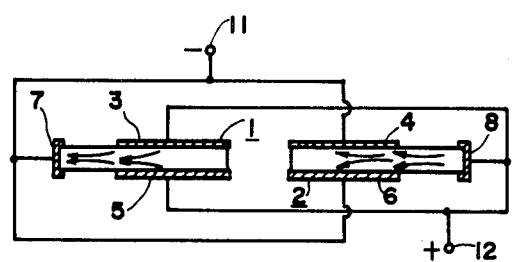
FIGS. 8 and 9 are cross-sectional views of another preferred form of the present invention.
Figure 9:
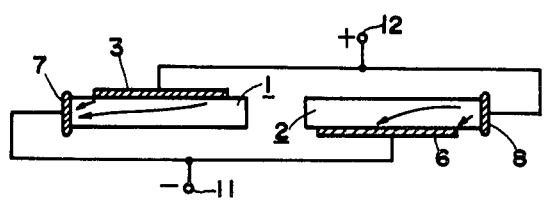

The electrode arrangement illustrated in FIGS. 3 and 4 is applicable to the thin type crystal vibrator. It is obvious from FIG. 8 that differences in strength of the distributed electric field in the thin type crystal vibrator are greater than that in the other type. This results in a good effect on flexural vibration. In addition, the scheme of FIG. 8 is favorable to mass production because it does not need laborious formation of the inner side electrodes. As shown in FIG. 9, it is possible to create flexural vibration by depositing electrodes 3, 6 only on the top wall and the bottom wall. Although the respective embodiments of the present invention have been described in terms of the fork type crystal vibrator, it is obvious to those skilled in the art that the present invention is equally applicable to the rod type crystal vibrator. The cut type of crystal does not matter as far as the present invention is concerned.

While only certain embodiments of the present invention have been described, it will be apparent to those skilled in the art that various changes and modifications may be made therein without departing from the spirit and scope of the invention as claimed.

What is claimed is:
1. A flexure type crystal vibrator comprising:
a crystal body including at least a first branch and a second branch;
electrode means deposited on the first and second branches of said crystal body;
driving means for applying a unidirectional electric field to the branches of said crystal body via the electrode means to create a first electric field and a second electric field in said first branch and said second branch, respectively, said electric fields being directed in substantially one direction and varying in strength along said one direction;
said first and second branches include a top wall means, bottom wall means, an inner wall means, and an outer wall means;
first top wall electrode means deposited on said top wall means of said first branch;
first bottom wall electrode means, electrically connected to said first top wall electrode means, deposited on said bottom wall means of said first branch;

second outer wall electrode means electrically connected to said first top wall electrode means and said first bottom wall electrode means, deposited on said outer wall means of said second branch;

second top wall electrode means deposited on said top wall means of said second branch;

second bottom wall electrode means, electrically connected to said second top wall electrode means, deposited on said bottom wall means of said second branch; and first outer wall electrode means, electrically connected to said second top wall and said second bottom wall electrode means, deposited on said outer wall means of said first branch, each of said wall electrode means occupying a surface area on said wall means of the first and second branches, the surface areas being approximately equal.

2. A flexure type crystal vibrator comprising:
a crystal body including at least a first branch and a second branch;
electrode means deposited on the first and second branches of said crystal body;
driving means for applying a unidirectional electric field to the branches of said crystal body via the electrode means to create a first electric field and a second electric field in said first branch and said second branch, respectively, said electric fields being directed in substantially one direction and varying in strength along said one direction;
said first and second branches include a top wall means, bottom wall means, an inner wall means, and an outer wall means;
first and second top wall electrode means deposited on said top wall means of the first and second branches, respectively;
first and second bottom wall electrode means deposited on said bottom wall means of the first and second branches, respectively, said top and bottom wall electrode means being deposited on spaced apart parallel planes such that a line passing through said top wall electrode means and normal to said spaced apart parallel planes will not pass through said bottom wall electrode means, whereby said first and second electric field between said top and bottom wall electrode means within each of the branches point in substantially one direction.

3. A flexure type crystal vibrator comprising:
a crystal body including at least a first branch and a second branch;
electrode means deposited on the first and second branches of said crystal body;
driving means for applying a unidirectional electric field to the branches of said crystal body via the electrode means to create a first electric field and a second electric field in said first branch and said second branch, respectively, said electric fields being directed in substantially one direction and varying in strength along said one direction;
said first and second branches include a top wall means, bottom wall means, an inner wall means, and an outer wall means;
first and second top wall electrode means deposited on said top wall means of the first and second branches, respectively;
first and second bottom wall electrode means deposited on said bottom wall means of said first and second branches, respectively;
first and second outer wall electrode means deposited on the outer wall means of the first and second branches, respectively; and
said first top wall and said first bottom wall electrode means being electrically associated with said second outer wall electrode means, and said second top wall and second bottom wall electrode means being electrically associated with said first outer wall electrode means to create said first and second electric fields which point in substantially one direction.

4. A flexure type crystal vibrator according to claim 3, wherein the surface area occupied by said first and second top wall electrode means and first and second bottom wall electrode means are approximately equal, and the surface area occupied by said first and second outer wall electrode means being correspondingly smaller than the surface area occupied by said top and bottom wall electrode means.

5. A flexure type crystal vibrator comprising:
a crystal body including at least a first branch and a second branch;
electrode means deposited on the first and second branches of said crystal body;
driving means for applying a unidirectional electric field to the branches of said crystal body via the electrode means to create a first electric field and a second electric field in said first branch and said second branch, respectively, said electric fields being directed in substantially one direction and varying in strength along said one direction;
said first and second branches include a top wall means, bottom wall means, an inner wall means, and an outer wall means;
first top wall electrode means deposited on said top wall means of said first branch;
second bottom wall electrode means deposited on said bottom wall means of said second branch; and
first and second outer wall electrode means deposited on the outer wall means of the first and second branches, respectively, said first top wall electrode means being electrically associated with said second outer wall electrode means, and said second bottom wall electrode means being electrically associated with said first outer wall electrode means.

6. A flexure type crystal vibrator according to claim 5, wherein the surface area occupied by said first top wall electrode means and said second bottom wall electrode means are approximately equal and the surface area occupied by said first and second outer wall electrode means being correspondingly smaller than the surface area occupied by said top and bottom wall electrode means.

7. A flexure type crystal vibrator comprising:
a crystal body including at least a first branch and a second branch;
electrode means deposited on the first and second branches of said crystal body;
driving means for applying a unidirectional electric field to the branches of said crystal body via the electrode means to create a first electric field and a second electric field in said first branch and said second branch, respectively, said electric fields being directed in substantially one direction and varying in strength along said one direction;

said first and second branches include a top wall means, bottom wall means, an inner wall means, and an outer wall means;

first top wall electrode means deposited on said top wall means of said first branch;

first bottom wall electrode means, electrically connected to said first top wall electrode means, deposited on said bottom wall means of said first branch;

second outer wall electrode means electrically connected to said first top wall electrode means and said first bottom wall electrode means, deposited on said outer wall means of said second branch;

second top wall electrode means deposited on said top wall means of said second branch;

second bottom wall electrode means, electrically connected to said second top wall electrode means, deposited on said bottom wall means of said second branch; and first outer wall electrode means, electrically connected to said second top wall and said second bottom wall electrode means, deposited on said outer wall means of said first branch.

* * * * *